United States Patent
Bauer et al.

(10) Patent No.: US 6,430,809 B1
(45) Date of Patent: Aug. 13, 2002

(54) METHOD FOR BONDING CONDUCTORS, IN PARTICULAR BEAM LEADS

(75) Inventors: Monika Bauer; Klemens Ferstl, both of Regensburg; Jens Pohl, Bernhardswald; Johann Winderl, Wackersdorf, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/580,983

(22) Filed: May 30, 2000

(30) Foreign Application Priority Data

May 27, 1999 (DE) .......................... 199 24 212

(51) Int. Cl.$^7$ .................. H01K 43/00; B23K 37/00; B23K 31/00
(52) U.S. Cl. .............. 29/827; 228/164; 228/180.5; 228/4.5
(58) Field of Search .............. 228/164, 180.5, 228/4.5; 29/827; 219/121.67

(56) References Cited

U.S. PATENT DOCUMENTS

| 4,689,875 | A | * | 9/1987 | Solstad ..................... 437/211 |
| 4,976,392 | A | | 12/1990 | Smith et al. |
| 5,153,981 | A | * | 10/1992 | Soto .......................... 29/701 |
| 5,283,946 | A | * | 2/1994 | Simmons et al. ............. 29/827 |
| 5,552,631 | A | * | 9/1996 | McCormick ................ 257/666 |
| 5,638,596 | A | * | 6/1997 | McCormick ................. 29/827 |
| 5,767,480 | A | * | 6/1998 | Anglin et al. ........... 219/121.69 |
| 5,787,581 | A | | 8/1998 | DiStefano et al. |
| 5,915,752 | A | * | 6/1999 | DiStefano et al. ............ 29/827 |
| 6,150,194 | A | * | 11/2000 | Sakaguchi et al. .......... 438/118 |
| 6,171,888 | B1 | * | 1/2001 | Lynch et al. ................ 438/123 |

OTHER PUBLICATIONS

Japanese Patent Abstract No. 3–206634 (Shiozaki), dated Sep. 10, 1991.
Japanese Patent Abstract No. 10041344 (Yasuharu et al.), dated Feb. 13, 1998.
Japanese Patent Abstract No. 07106370 (Yoshimasa), dated Apr. 21, 1995.

* cited by examiner

Primary Examiner—Tom Dunn
Assistant Examiner—L. Edmondson
(74) Attorney, Agent, or Firm—Laurence A. Greenberg; Werner H. Stemer; Ralph E. Locher

(57) ABSTRACT

A method for bonding conductors onto semiconductor components is disclosed, where an opening is provided in an insulation layer on a semiconductor component. At least one conductor extends across the opening, where the conductor is bonded onto the semiconductor component by a bonding tool, which bends the conductor in the region of the opening toward the semiconductor component. Prior to the bonding, the conductor is severed in the region of the opening.

4 Claims, 3 Drawing Sheets

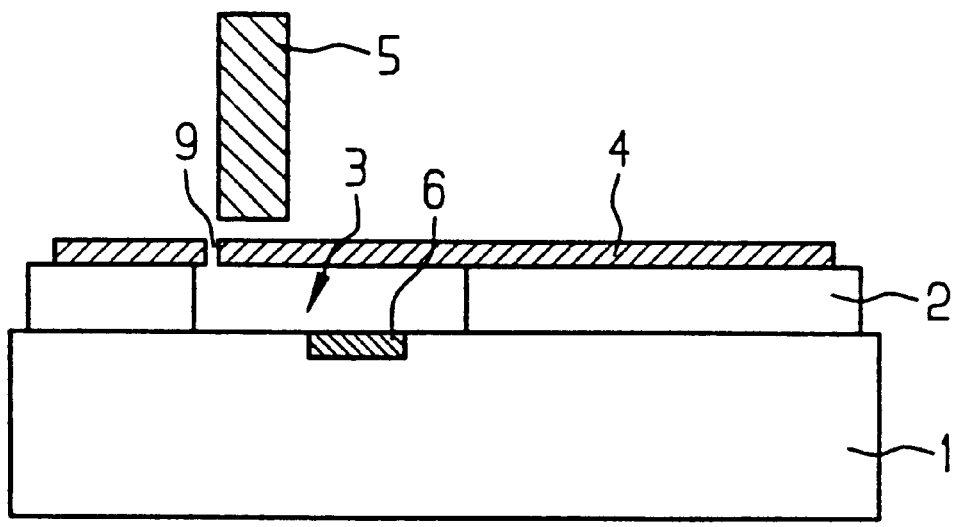

METHOD FOR BONDING CONDUCTORS, IN PARTICULAR BEAM LEADS

BACKGROUND OF THE INVENTION

Field of the Invention

The present invention relates to a method for bonding conductors, in particular for bonding beam leads, where a bonded connection is produced between a conductor and a semiconductor component. In this case, an insulation layer is applied on a semiconductor component and openings in the insulation layer are provided in the insulation layer above those regions of the semiconductor component in which the bonded connections are intended to be produced, with the result that the semiconductor component becomes accessible for a bonded connection. In this case, a single opening may be provided over the entire region with which contact is to be made, or alternatively a plurality of openings may be provided in the insulation layer.

One or more conductors are disposed on the insulation layer in such a way that the conductor extends across at least one of the openings. The conductor can be bonded onto the semiconductor element by a bonding tool bending the conductor in the region of the opening toward the semiconductor component and producing the bonded connection between the conductor and the semiconductor component.

It is known from the prior art, for example from U.S. Pat. No. 5,787,581, that when the conductor is bent by the bonding tool, the conductor tears away in the region of the opening. This allows better bending of the conductor in the direction toward the semiconductor component and hence simpler production of the bonded connection between the conductor and the semiconductor component. What is problematic in this case, however, is that a tensile load occurs in the conductor due to the pressure exerted by the bonding tool on the conductor for tearing-away and bending purposes. The tensile load leads to weakening of the material structure of the conductor and hence to a reduction in the long-term reliability, in particular with regard to mechanical and thermal loads on the conductor. This structural weakening and the resultant material fatigue occur principally in that region of the conductor in which the bonded connection is effected.

This effect can be reduced somewhat if, as proposed in U.S. Pat. No. 5,787,581, a desired breaking point is provided in the conductor in the region of the opening, which allows the conductor to tear away under the pressure of the bonding tool at a manifestly lower pressure. However, the effect of structural weakening cannot be completely prevented even by such a desired breaking point, in particular because production tolerances that occur can give rise to the situation where the conductor can tear away only at a relatively high pressure of the bonding tool if the desired breaking point has not been structured to be sufficiently thin. Such production tolerances are, as a rule, virtually unavoidable.

SUMMARY OF THE INVENTION

It is accordingly an object of the invention to provide a method for bonding conductors, in particular beam leads, that overcomes the above-mentioned disadvantages of the prior art methods of this general type, which prevents structural weakening and hence material fatigue of the conductor.

With the foregoing and other objects in view there is provided, in accordance with the invention, a bonding method, which includes the steps of:

applying an insulation layer on a semiconductor component, the insulation layer having at least one opening formed therein and disposed above a region of the semiconductor component that is to be bonded;

disposing at least one conductor on the insulation layer such that the conductor extends across the opening;

severing the conductor in a region of the opening; and subsequently bonding the conductor onto the semiconductor component using a bonding tool, the bonding tool bending the conductor in the region of the opening toward the semiconductor component and produces a bonded connection between the conductor and the semiconductor component.

If, prior to the bonding, the conductor is completely severed in the region of the opening, then the occurrence of tensile loads when the conductor is bent by the bonding tool can be effectively prevented. In this case, by way of example, the conductor can be severed mechanically or, as an alternative, also with the aid of a laser.

Although U.S. Pat. No. 4,976,392 discloses providing a bonding tool which has an integrated cutting tool, this document merely discloses a method in which, after the bonding of a bonding wire, the bonding wire is severed by the cutting tool. A possible way of avoiding tensile loads in the conductor before and during bonding is not provided by this method, however, since the conductor is severed only after the production, application, structuring and bonding of the conductor.

In accordance with an added feature of the invention, there is the step of severing mechanically the conductor during the severing step.

In accordance with an additional feature of the invention, there is the step of using a laser for the severing of the conductor.

In accordance with a concomitant feature of the invention, there is the step of producing the conductor as a beam lead for making contact with the semiconductor component.

Other features which are considered as characteristic for the invention are set forth in the appended claims.

Although the invention is illustrated and described herein as embodied in a method for bonding conductors, in particular beam leads, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE DRAWINGS

FIG. 4 is a sectional view for severing of the conductor prior to bonding according to the invention.

DESCRIPTION OF THE PREFERRED EMBODIMENT

Figure 1A:
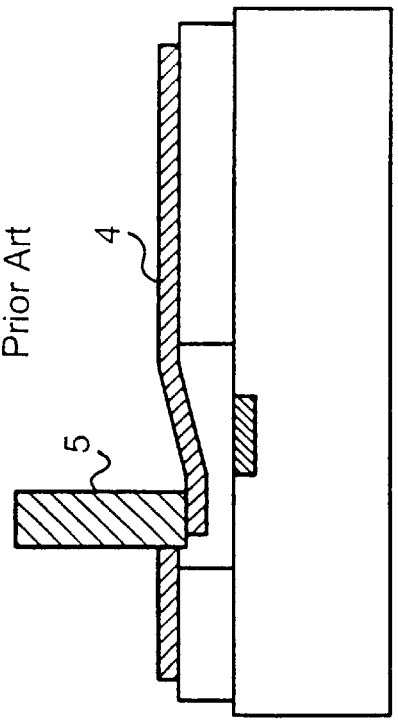
FIGS. 1a–1d are diagrammatic, sectional views of a fundamental bonding process of a conductor according to the prior art.
Figure 1B:
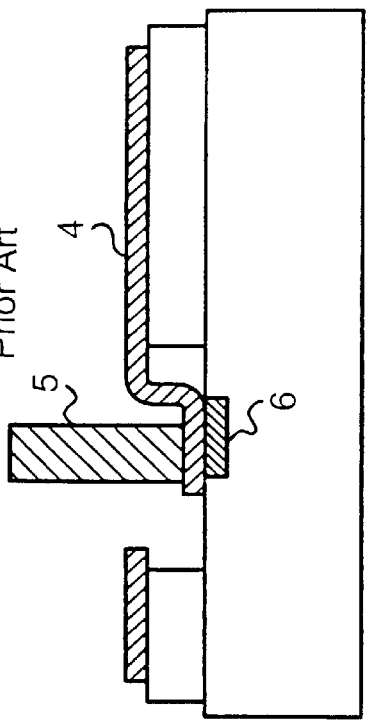
Figure 1C:
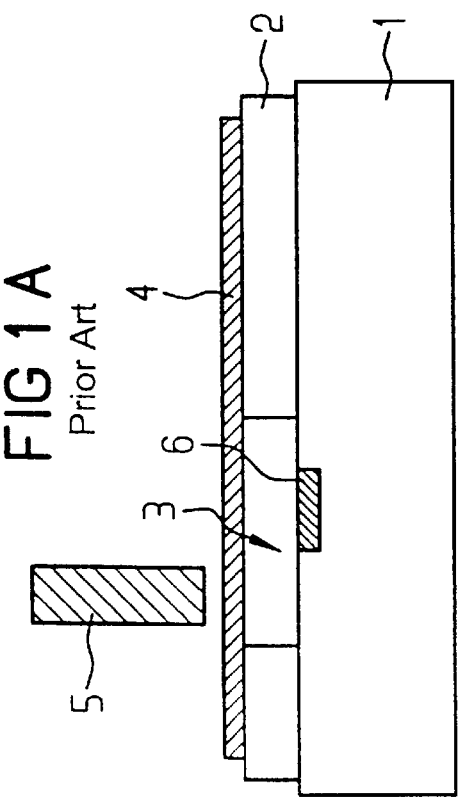
Figure 1D:
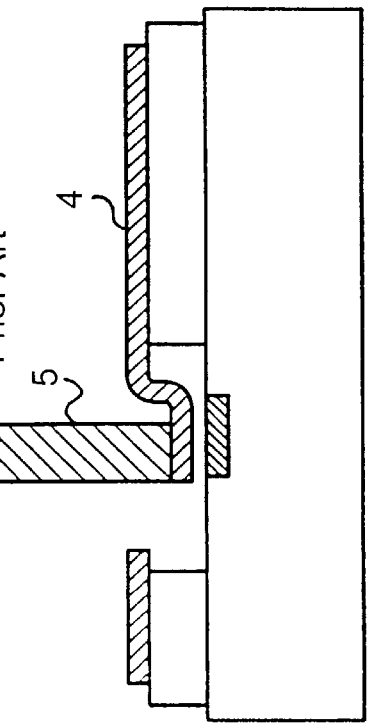

In all the figures of the drawing, sub-features and integral parts that correspond to one another bear the same reference symbol in each case. Referring now to the figures of the drawing in detail and first, particularly, to FIGS. 1a–1d thereof, there is shown a fundamental bonding process according to the prior art, where an insulation layer 2 is applied to a semiconductor chip 1. The insulation layer 2 has an opening 3 in a region in which a bonded connection is intended to be produced on a bonding pad 6. A conductor 4, which is configured as a beam lead, extends across the opening 3 and is disposed on the insulation layer 2, where the conductor 4 bears on the insulation layer 2 on both sides of the opening 3. For bonding purposes, a bonding tool 5 is used which, as shown by FIG. 1b, exerts a pressure on the conductor 4, as a result of which the conductor 4 tears off in the region of the opening 3 and can be bent toward the semiconductor chip 1 by the bonding tool 5. Finally, as illustrated in FIGS. 1c and 1d, the bonding tool 5 produces the bonded connection between the conductor 4 and the semiconductor chip 1 on the bonding pad 6. In order to simplify the tearing-away of the conductor 4 in the region of the opening 3, a desired breaking point may be provided in the conductor 4.

Figure 2:
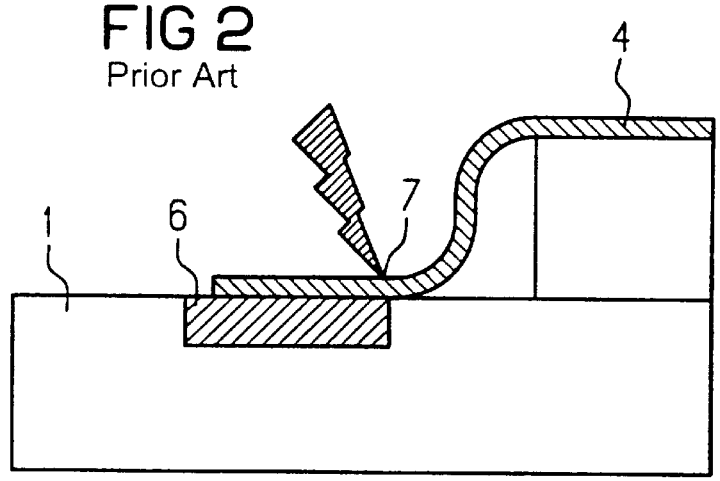
FIG. 2 is a sectional view showing an area of weakened material of the conductor in a bond region according to the prior art.

As illustrated in FIG. 2, however, material weakening results in the conductor 4 in the case of the method according to the prior art. The material weakening is most severely pronounced in particular in the region of the bonded connection in the conductor 4, since that is where the greatest tensile load occurred during the severing and bending of the conductor 4.

A weak point 7 thus results, which is susceptible to mechanical and thermal loads on the conductor 4.

Figure 3:
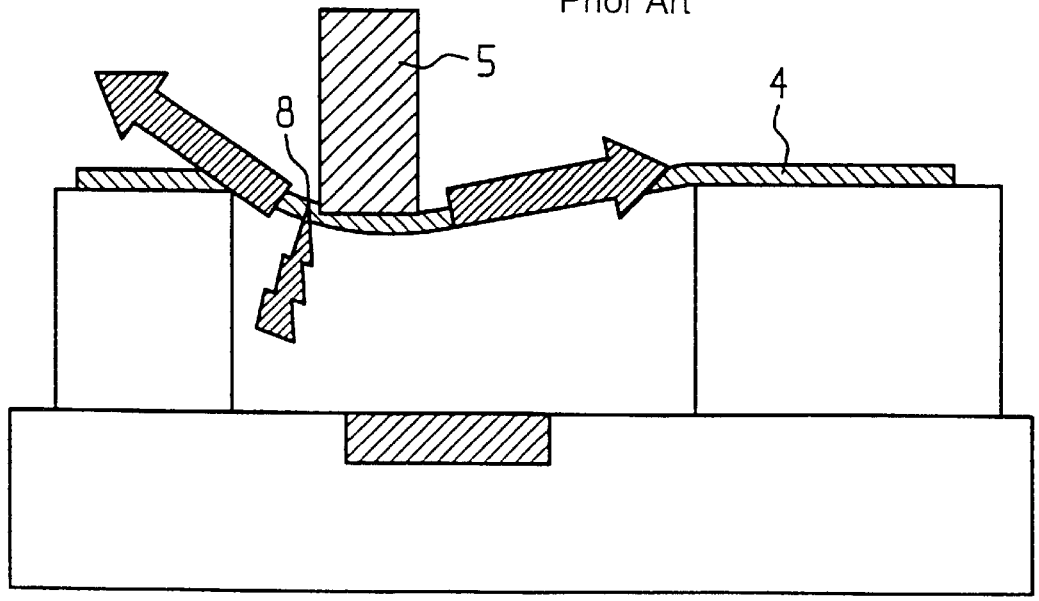
FIG. 3 is a sectional view showing tensile loading in the conductor due to a pressure of a bonding tool according to the prior art.

The tensile loads that occur in the conductor 4 are illustrated diagrammatically by arrows in FIG. 3, the tensile loads resulting from the pressure of the bonding tool 5 on the conductor 4. The conductor 4 tears away in a region 8, which may be configured as a desired breaking point.

FIG. 4 illustrates the bonding method which is improved according to the invention, where, prior to bonding, that is to say in particular before the bonding tool 5 bends the conductor 4 in the direction toward the semiconductor chip 1 by exerting pressure on the conductor 4, the conductor 4 is severed at a predefined point 9. The severing may be effected mechanically or else by a laser. If pressure is then subsequently exerted on the conductor 4 by the bonding tool 5 in order to bend the conductor 4, the tensile loads illustrated in FIG. 3 are no longer produced on the conductor 4. The conductor 4 can thus be bent practically without any weakening of the material structure of the conductor 4. The production of the bonded connection between the conductor 4 and the bonding pad 6 by the bonding tool 5 is subsequently effected in the customary manner, as is already known from the prior art.

We claim:

1. A bonding method, which comprises:

applying an insulation layer on a semiconductor component, the insulation layer having at least one opening formed therein and disposed above a region of the semiconductor component that is to be bonded;

disposing at least one conductor on the insulation layer such that the conductor extends across the opening;

severing the conductor in a region of the opening; and subsequently bonding the conductor onto the semiconductor component using a bonding tool, the bonding tool bending the conductor in the region of the opening toward the semiconductor component and produces a bonded connection between the conductor and the semiconductor component.

2. The method according to claim 1, which comprises severing mechanically the conductor during the severing step.

3. The method according to claim 1, which comprises using a laser for the severing of the conductor.

4. The method according to claim 1, which comprises producing the conductor as a beam lead for making contact with the semiconductor component.

* * * * *